United States Patent [19]

Addamiano et al.

[11] Patent Number: 4,512,825
[45] Date of Patent: Apr. 23, 1985

[54] RECOVERY OF FRAGILE LAYERS PRODUCED ON SUBSTRATES BY CHEMICAL VAPOR DEPOSITION

[75] Inventors: Arrigo Addamiano, Alexandria, Va.; Philipp H. Klein, Washington, D.C.

[73] Assignee: The United States of America as represented by the Secretary of the Navy, Washington, D.C.

[21] Appl. No.: 484,346

[22] Filed: Apr. 12, 1983

[51] Int. Cl.³ ............... H01L 21/205; H01L 21/461
[52] U.S. Cl. ................... 148/175; 29/576 G; 29/576 T; 29/580; 148/DIG. 54; 148/DIG. 135; 148/DIG. 148; 156/610; 156/612; 156/DIG. 83; 156/DIG. 88; 156/DIG. 98
[58] Field of Search ......... 148/175; 29/576 E, 576 T, 29/580; 156/612, DIG. 83, DIG. 88, DIG. 98, DIG. 80, 610

[56] References Cited

U.S. PATENT DOCUMENTS

| | | | |
|---|---|---|---|
| 3,436,255 | 4/1969 | Harris et al. | 156/612 X |
| 3,520,740 | 7/1970 | Addamiano | 148/175 |
| 3,960,619 | 6/1976 | Seiter | 148/175 |
| 3,993,533 | 11/1976 | Milnes et al. | 148/175 X |
| 4,116,751 | 9/1978 | Zaromb | 156/612 X |
| 4,303,463 | 12/1981 | Cook | 156/DIG. 88 |
| 4,308,078 | 12/1981 | Cook | 156/DIG. 80 |

OTHER PUBLICATIONS

D. M. Jackson and R. W. Howard, Trans. Metall. Soc. AIME 233 468, (1965).
H. Matsunami, S. Nishino and T. Tanaka, J. of Crystal Growth 45, 138, (1978).
S. Nishino, Y. Hazuki, H. Matsunami and T. Tanaks, J. Electrochem. Soc. 127, 2674, (1980).
W. G. Spitzer et al., Intern. Conf. on Silicon Carbide, Boston, Mass., 1959.
Milnes et al., "Peeled Film Technology for Solar Cells", 11th IEEE Photospecialist Conference, May 6–8, 1975, pp. 338–341.

Primary Examiner—William G. Saba
Attorney, Agent, or Firm—Robert F. Beers; William T. Ellis; Alan P. Klein

[57] ABSTRACT

A method of recovering intact at room temperature a layer of a first material, such as silicon carbide, produced by depositing it from the gas phase at a deposition temperature above room temperature on a substrate of a second material, such as silicon, having a different coefficient of thermal expansion than that of the first material. The substrate is separated from the layer prior to cooling, and then the separated layer is cooled to room temperature free of stresses otherwise present as a result of the different thermal expansions of the substrate and layer.

14 Claims, 1 Drawing Figure

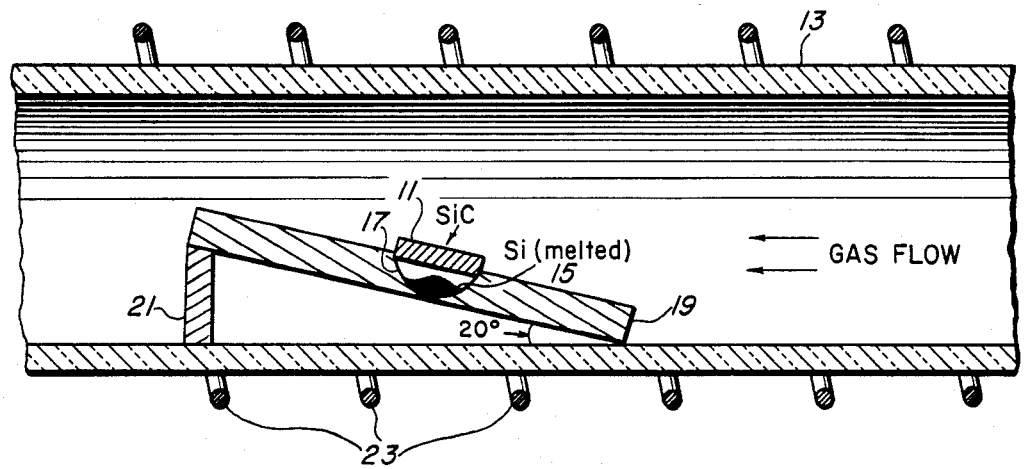

RECOVERY OF FRAGILE LAYERS PRODUCED ON SUBSTRATES BY CHEMICAL VAPOR DEPOSITION

BACKGROUND OF THE INVENTION

The present invention relates generally to coating, and more particularly to coating wherein a semiconductor product is produced.

Chemical Vapor Deposition (hereafter CVD) is one of the preferred techniques to prepare large area semiconductor devices. As the name implies, the technique involves the deposition from the gas phase of elements or compounds over a suitable "substrate." Ideally a perfect crystallographic lattice match between the deposited material and the substrate is preferred, and the coefficients of expansion of the substrate and the deposited material should be the same or very close. When these conditions are met, it is possible to obtain smooth deposited layers on the substrates and to change the temperature of the systems without the limitations introduced by differential expansion. If on the other hand, the thermal expansions of substrates and deposited layers are different, severe complications arise. In particular, the stresses due to temperature changes can result in breaking, cracking, bending and peeling off of the deposited layers (which are usually much thinner than the substrates). For these reasons, and, additionally, because of purity requirements, the preferred substrate for the CVD of silicon is a silicon wafer, the preferred substrate for the CVD of gallium arsenide is a GaAs wafer, and so on. If a large area substrate of the material whose CVD is wanted does not exist, one looks for other suitable substrates. In the case of silicon carbide, SiC, large area wafers of SiC are not available, because SiC dissociates before melting and it is impossible to prepare "boules" of single-crystal SiC to be sliced and polished. Crystals with similar structure and compatible lattice dimensions, e.g., aluminum nitride, AlN; boron phosphide, BP; etc., are not commercially available. However, they could introduce electrically active impurities in the layers of deposited SiC. For these and other reasons, a preferred substrate for the CVD of SiC is silicon, which is easily available and is not an impurity in SiC. Unfortunately, silicon is a very poor match to SiC, both from the standpoint of lattice dimensions and thermal expansion. Thus, the lattice dimension (cubic cell edge) of SiC is 4.359 angstroms at room temperature, while the lattice dimension of Si is 5.430 angstroms. Also large differences in the thermal expansions exist, which depend on the temperature interval considered.

It follows that while the process of CVD of SiC on Si may be performed without difficulties, the recovery of the deposited layers may be prevented by cracking and breaking of the layers when the temperature is changed from deposition temperature down to room temperature. Experience has shown that good quality crystalline layers of SiC are preferentially obtained at high temperatures. Using silicon as substrate, this means that one can operate up to the melting point of silicon, which is close to 1410° C. Taking 1400° C. as a practical upper limit for the CVD of SiC on Si, when the deposition process is terminated, one is left with the problem of how to bring the grown layers intact from approximately 1400° C. down to room temperature. It is found that only extremely thin layers of SiC on Si, a few hundred angstroms at the most, can survive the cooling process without introduction of stresses, mechanical defects or breakage. These limitations are obvious from the literature on CVD of SiC on Si, in particular the following references: D. M. Jackson and R. W. Howard, Trans. Metall. Soc. AIME 223, 468 (1965); H. Matsunami, S. Nishino and T. Tanaka, J. of Crystal Growth 45, 138 (1978); S. Nishino, Y. Hazuki, H. Matsunami and T. Tanaka, J. Electrochem. Soc. 127; 2674 (1980); W. G. Spitzer et al., *Intern. Conf. on Silicon Carbide*, Boston, Mass. 1959 pp. 347-364.

SUMMARY OF THE INVENTION

It is therefore an object of this invention to recover intact at room temperature a layer of a material produced by depositing it from the gas phase at a deposition temperature above room temperature on a substrate of another material having a different coefficient of thermal expansion.

Another object is to prevent the layer from breaking, cracking, bending or peeling off the substrate when the substrate and layer are cooled from the deposition temperature to room temperature.

These and other objects of the present invention are achieved in one aspect by a method wherein the substrate is separated from the layer prior to cooling, and then the separated layer is cooled to room temperature. In this way, the separated layer is not subjected to stresses caused by the different thermal expansion of the substrate and layer when they are cooled to room temperature.

In another aspect, the invention involves a device for separating the substrate from the fragile layer prior to cooling. The device includes means for melting the substrate, and means for supporting the layer so that it can fall a distance no greater than the thickness of the substrate when the substrate melts. Since the layer is supported it is unlikely to break when separated from the substrate.

Additional advantages and features will become more apparent as the subject invention becomes better understood by reference to the following detailed description when considered in conjunction with the accompanying drawings wherein:

BRIEF DESCRIPTION OF THE DRAWING

The sole FIGURE is a diagrammatic view of a device for separating a substrate from a fragile layer.

DESCRIPTION OF THE PREFERRED EMBODIMENT

A process of producing a layer of one material by depositing it from the gas phase on a substrate of another material which has a different coefficient of thermal expansion and a lower melting point includes a first step in which the substrate is prepared.

The second step is setting the substrate on a heating element in a reaction tube.

Next, the third step is performed, whereby the reaction tube is purged.

In the fourth step, the temperature of the heating element is raised from room temperature to the deposition temperature and a selected mixture of reacting gases is allowed to flow through the reaction tube to deposit the layer from the gas phase on the substrate.

The process to this point has been disclosed in the prior art and has been in common use for some time and consequently, the description has not been detailed.

There are numerous alternatives to arriving at the same general partially-completed device with steps rearranged and/or other steps or materials added or deleted.

The next step in the process would normally involve shutting off the power to the heating element, and allowing the layer to cool to room temperature so that it can be recovered. In the subject invention, prior to cooling and after completion of the deposition, the substrate is separated from the layer. While the separating step may take a variety of forms, conveniently it may take the form of melting the substrate while supporting the fragile layer so that it falls a distance no greater than the thickness of the substrate when the substrate melts. The act of melting the substrate may conveniently be accomplished by heating the substrate to a temperature sufficiently above its melting point that the viscosity of the molten substrate is reduced and its separation from the layer is favored, and at a low enough temperature and for a short enough time that the layer itself is not dissociated. After the separation step, the layer is cooled to room temperature and recovered.

The step of separating the substrate from the layer prior to cooling has the beneficial result that the separated layer is not subjected to stresses caused by the different thermal expansions of the substrate and layer when it is cooled from the deposition temperature to room temperature and it can therefore be recovered intact, whereas in the prior art when the substrate and layer were not separated prior to cooling the different thermal expansion caused the layer to break, crack, bend or peel off the substrate upon cooling.

For a clearer understanding of the invention, a specific example of it is set forth below. This example is merely illustrative and is not to be understood as limiting the scope and underlying principles of this invention in any way.

EXAMPLE

The FIGURE shows a layer 11 of silicon carbide produced in the manner of the above-cited references by depositing it from the gas phase in a reaction tube 13 on a silicon substrate 15. A deposition temperature of 1400° C. which is close to the melting point of silicon was maintained. (The melting point of silicon is 1410° C.). The substrate 15 was placed inside a hemispherical cavity 17 formed in the upper face of a graphite susceptor 19 and was supported at its edges by the wall of the cavity. The dimensions of the substrate was $1.2 \times 1.2 \times 0.02$ cm$^3$. The dimensions of the susceptor were approximately $3.3 \times 2.2 \times 0.5$ cm$^3$. The susceptor 19 was tilted at a angle of 20° from the horizontal by means of a graphite support leg 21, and was inductively heated by a radiofrequency coil 23 surrounding the reaction tube 13. At the end of the deposition process at 1400° C., the temperature was quickly brought well above the melting point of silicon to favor separation of the substrate 15 from the silicon carbide layer 11. A quick temperature rise in the range 1500° C. to 1550° C. for less than a minute was sufficient to melt the substrate 15. Higher temperatures and longer operating times were avoided since silicon carbide has an appreciable dissociation pressure near and above 1700° C. Also phase transformations can occur. Surface tension caused the molten substrate 15 to ball up at its center and fall into the cavity 17 of the graphite susceptor 19, as shown in the FIGURE. As the substrate 15 melted, the silicon carbide layer 11 slipped down into the cavity 17. Since the substrate 15 was supported at its edges, the separated layer 11 fell through a distance no greater than the thickness of the substrate, and it did not break. The separated layer 11, freed from stresses, was then cooled to room temperature and recovered intact. A final one to two minute treatment of the silicon carbide layer 11 with "white etch" (a 1 part by volume hydrofluoric acid to 3 parts by volume nitric acid mixture) eliminated any residual traces of free silicon.

It is obvious that many modifications and variations of the present invention are possible in light of the above teachings. For example, a multiple layer structure, such as a layer of n-type silicon carbide on a layer of p-type silicon carbide can likewise be separated from a silicon substrate by the same technique. It is therefore to be understood that within the scope of the appended claims, the invention may be practiced otherwise than as described.

What is claimed as new and desired to be secured by Letters Patent of the United States is:

1. A method of recovering intact at room temperature a layer of a first material produced by depositing it from the gas phase at a deposition temperature above room temperature on a substrate of a second material having a lower melting point and a different coefficient of thermal expansion than that of the first material, the uncoated side of the substrate being the underside of the substrate and the side of the layer adjacent to the substrate being the underside of the layer, comprising the steps of:

supporting the substrate underside around its perimeter along a support plane at a non-orthogonal incline from horizontal;

separating the substrate from the layer by heating the substrate to melt the substrate from the layer;

receiving the freed layer underside around its perimeter along a plane parallel to the support plane after it displaces in the range of the thickness of the substrate; and cooling the separated layer to room temperature, whereby the separated layer is not subjected to stresses caused by the different thermal expansion of the substrate and layer when they are cooled to room temperature.

2. The method recited in claim 1 wherein the melting step includes:

heating the substrate to a temperature sufficiently above its melting point to reduce the viscosity of the molten substrate and favor its separation from the layer.

3. The process recited in claim 2 wherein:

the substrate is heated to the temperature above its melting point for a short enough time that the layer is not dissociated.

4. The process recited in claim 3 wherein:

the substrate is heated at a low enough temperature that the layer is not dissociated.

5. The method recited in claim 4, wherein the step of supporting the substrate includes supporting the substrate along the support plane at an incline in the range of 20 degrees from horizontal.

6. A method of recovering intact at room temperature a layer of a material produced by depositing it from the gas phase at a deposition temperature on a silicon substrate having a lower melting point and a different coefficient of thermal expansion than that of the material, the uncoated side of the substrate being the underside of the substrate and the side of the layer adjacent to the substrate being the underside of the layer, comprising the steps of:

supporting the substrate underside around its perimeter along a support plane at an incline from horizontal in the range of 20 degrees;

separating the substrate from the layer by heating the substrate to a temperature sufficiently above its melting point to melt the substrate and reduce the viscosity of the melted substrate to favor its separation from the layer, and for a short enough time so that the layer is not dissociated;

receiving the freed layer underside around its perimeter along a plane parallel to the support plane after it displaces in the range of the thickness of the substrate; and cooling the separated layer to room temperature, whereby the separated layer is not subjected to stresses caused by the different thermal expansions of the substrate and layer when cooled.

7. The method recited in claim 6 wherein:
the material of the layer is silicon carbide.

8. The method recited in claim 7 wherein:
the silicon substrate is heated to a temperature in the range of 1500° C. to 1550° C.

9. The method recited in claim 8 wherein:
the silicon substrate is heated to the temperature in the range of 1500° C. to 1550° C. for less than a minute.

10. The method recited in claim 9 wherein:
the deposition temperature is 1400° C.

11. A method of recovering intact at room temperature a layer of silicon carbide produced by depositing it from the gas phase at 1400° C. on a silicon substrate, the uncoated side of the substrate being the underside of the substrate and the side of the layer adjacent to the substrate being the underside of the layer, comprising the steps of:

supporting the substrate underside around its perimeter in a hemispherical cavity formed in the upper face of a susceptor positioned with an incline from horizontal in the range of 20° degrees;

separating the substrate by heating it to a temperature in the range of 1500° C. to 1550° C. for less than a minute to melt the substrate from the layer;

receiving the freed layer underside along its permimeter in the hemispherical cavity after the layer displaces in the range of the thickness of the substrate; and cooling the separated layer to room temperature;

whereby the separated layer is not subjected to stresses caused by the different thermal expansions of the substrate and layer when cooled.

12. The method recited in claim 11 including the step of:
etching the separated layer after it is cooled to room temperature in order to eliminate any residual traces of free silicon.

13. The method recited in claim 12 wherein:
the separated layer is etched with a mixture of one part-by-volume hydrofluoric acid to three parts-by-volume of nitric acid.

14. The method recited in claim 13 wherein:
the separated layer is etched for one to two minutes.

* * * * *